United States Patent [19]
Kawatsuji et al.

[11] Patent Number: 6,127,090

[45] Date of Patent: Oct. 3, 2000

[54] PROCESS AND APPARATUS FOR PRODUCING HIGH ACCURACY PHOTOSENSITIVE RESIN PRINTING PLATE

[75] Inventors: Shinichi Kawatsuji; Mitsuhiro Watanabe, both of Fuji, Japan

[73] Assignee: Asahi Kasei Kogyo Kabushiki Kaisha, Osaka, Japan

[21] Appl. No.: 09/152,249

[22] Filed: Sep. 11, 1998

[30] Foreign Application Priority Data

Sep. 11, 1997 [JP] Japan .................................. 9-247207

[51] Int. Cl.⁷ .............................. B05C 11/10; B05B 3/18; G03F 7/16
[52] U.S. Cl. ....................... 430/270.1; 118/679; 118/323; 430/935
[58] Field of Search ..................... 396/604, 611; 427/358, 144; 118/679, 683, 323; 430/269, 935, 300, 306; 355/85, 100

[56] References Cited

U.S. PATENT DOCUMENTS

| | | | |
|---|---|---|---|
| 4,056,423 | 11/1977 | Hughes | 430/300 |
| 4,383,759 | 5/1983 | Bloothoofd et al. | 355/85 |
| 4,773,841 | 9/1988 | Kawatsuji | 425/141 |

*Primary Examiner*—Janet Baxter
*Assistant Examiner*—Sin J. Lee
*Attorney, Agent, or Firm*—Birch, Stewart, Kolasch & Birch, LLP

[57] ABSTRACT

A process for producing a photosensitive resin printing plate comprising a step of forming a liquid photosensitive resin into a layer by applying the same to a substrate with a bucket, wherein a forming speed variation point for said layer is set at a position which is 30 to 80% of the forming distance of said layer, and wherein the liquid photosensitive resin is formed into a layer by successively reducing the forming speed thereafter.

12 Claims, 3 Drawing Sheets

PROCESS AND APPARATUS FOR PRODUCING HIGH ACCURACY PHOTOSENSITIVE RESIN PRINTING PLATE

BACKGROUND OF THE INVENTION

1. Field of the Invention

The present invention relates to a process and an apparatus for producing a photosensitive resin printing plate for letterpress printing such as corrugated board printing, film printing, and seal and label printing. Particularly, the invention pertains to such a process and apparatus designed to improve the thickness accuracy of photosensitive resin printing plates.

2. Description of the Related Art

Generally, for producing a printing plate using a liquid photosensitive resin, as illustrated in FIG. 1 of the accompanying drawings, first a negative film 2 and a cover film 3 are attached tightly on a lower transparent substrate 1 by utilizing vacuum or other means, then a photosensitive resin layer 4' is laminated thereon by a suitable means such as a bottom-open bucket as shown in FIG. 2, and then a base film 7 and a masking film 8 are laid thereon as shown in FIG. 3. Thereafter, active light is applied via an upper transparent substrate 11 placed on the spacers 10 set for determining the thickness of the photosensitive resin printing plate to effect masking exposure for forming the base of the relief portion, after which active light is further applied via the negative film 2 from the lower transparent substrate 1 side to effect relief exposure for forming the image of the relief portion. Then the masking film 8 is removed and back exposure is conducted via the upper transparent substrate 11 for fixing the formed relief portion on the base film 7 in a stabilized way.

In some cases, final back exposure can be omitted.

Then the uncured portion is washed away with a suitable detergent to develop the cured portion, followed by post-exposure and drying to obtain a printing plate.

The following method is also prevalently used: A negative film 2 and a cover film 3 are placed tightly on a lower transparent substrate 1 without using a masking film, then a photosensitive resin layer 4' is laminated thereon, and a base film 7 is placed on this resin layer. Thereafter, active light is applied via an upper transparent substrate 11 placed on the spacers 10 set for determining the thickness of the printing plate to be produced, thereby to effect back exposure for forming the basal part of the printing plate, and then active light is further applied via the negative film 2 from the lower transparent substrate 1 side to effect relief exposure, followed by development, post-exposure and drying.

However, when a thick (usually 7 mm) and large-sized (over 1 m long) plate such as generally used for corrugated board printing or the like is made using the above techniques, the laminated resin thickness distribution tends to become nonuniform due to a decrease in the amount of the resin in the bucket with the advance of lamination, thereby resulting in an abnormal reduction of the plate thickness at the rear end portion of the laminate, which can cause improper printing. This phenomenon is attributable to the fact that the resin is laminated at a constant rate despite variation in the amount of liquid photosensitive resin amount in the bucket.

In order to overcome this problem, it has been proposed to reduce the resin laminating speed halfway in the process. This method, however, was not necessarily satisfactory, since as it was not suited for making plates of greater sizes and the required laminating speed reduction would affect the thickness accuracy of the plate produced.

Accordingly, the present invention is designed to eliminate these prior art problems and to provide a process for producing a thick and large-sized printing plate with high thickness accuracy in a stabilized way.

For attaining the same object as that of the present invention, a method has been proposed in which resin forming is carried out by making use of a combination of a multimanifold and a constant-rate resin feed pump (U.S. Pat. No. 4,383,759). This method, however, requires adjustment of several mechanical arrangements or an operation for altering the setting every time the thickness of the plate to be produced is changed in manufacturing the printing plates of different thicknesses. Such an operation is troublesome and subject or succeptable to mistakes. Further, there are required two types of metering pump according to the thickness of the plate to be produced (thin plate or thick plate), which fact complicates the process and makes the apparatus costly.

In contrast, the present invention features a compact combination of a speed controlling motor and control software, hence is low in cost, and allows for a very easy alteration of plate thickness with a simple plate thickness input operation alone, without requiring any other operations, by incorporating the device of U.S. Pat. No. 4,773,841.

SUMMARY OF THE INVENTION

In the course of studies on the subject matter, the present inventors found that the above problems could be solved by conditioning, in particular, the following three parameters: initial forming speed, forming speed variation point and forming speed variation, in the plate making process.

Thus, the present invention is concerned with providing:

(1) A process for producing a photosensitive resin printing plate comprising a step of forming a liquid photosensitive resin into a layer by applying the same to a substrate with a bucket, wherein a forming speed variation point for said layer is set at a position which is 30 to 80% of the forming distance of said layer, and wherein the liquid photosensitive resin is formed into a layer by successively reducing the forming speed thereafter.

(2) An apparatus for producing a photosensitive resin printing plate having means for forming a liquid photosensitive resin into a layer by applying the same to a substrate with a bucket, said apparatus comprising a mechanism for controlling three parameters that are associated with forming the layer and which are: (A) initial forming speed, (B) forming speed variation point and (C) forming speed variation.

The process of the present invention includes the following embodiments (a) and (b):

(a) A negative film and a cover film are laminated on a lower transparent substrate, then a liquid photosensitive resin is laminated thereon by a bucket by controlling the following three parameters: (A) initial forming speed, (B) forming speed variation point and (C) forming speed variation (hereinafter referred to as three-parameter method), and then a base film, a masking film and an upper transparent substrate are laminated in this order. Thereafter, masking exposure is conducted via the upper transparent substrate, then relief exposure is performed via the lower transparent substrate, and after removing the masking film, back exposure is carried out via the upper transparent substrate, followed by removal of the uncured liquid photosensitive resin.

(b) A negative film and a cover film are laminated on a lower transparent substrate, then a liquid photosensitive resin is laminated thereon by controlling the above-mentioned three parameters, and then a base film and an upper transparent substrate are laminated. Thereafter, back exposure is conducted via the upper transparent substrate, then relief exposure is performed via the lower transparent substrate, and finally the uncured portion of liquid photosensitive resin is removed.

BRIEF DESCRIPTION OF THE DRAWINGS

FIGS. 4-1 and 4-2 show the photosensitive resin forming speed diagrams in a conventional method.

PREFERRED EMBODIMENTS OF THE INVENTION

In the printing plate producing process according to the present invention, it is possible to use the liquid photosensitive resins such as shown in U.S. Pat. Nos. 3,960,572, 4,006,024, 4,716,094, 5,288,571, 5,589,306, U.S. application Ser. No. 702,537, and JP-A-7-295218, as plate material. It is also possible to use a photosensitive resin printing plate making apparatus disclosed in U.S. Pat. No. 4,773,841. All of said disclosures are incorporated herein by reference in their entirety.

Figure 3:
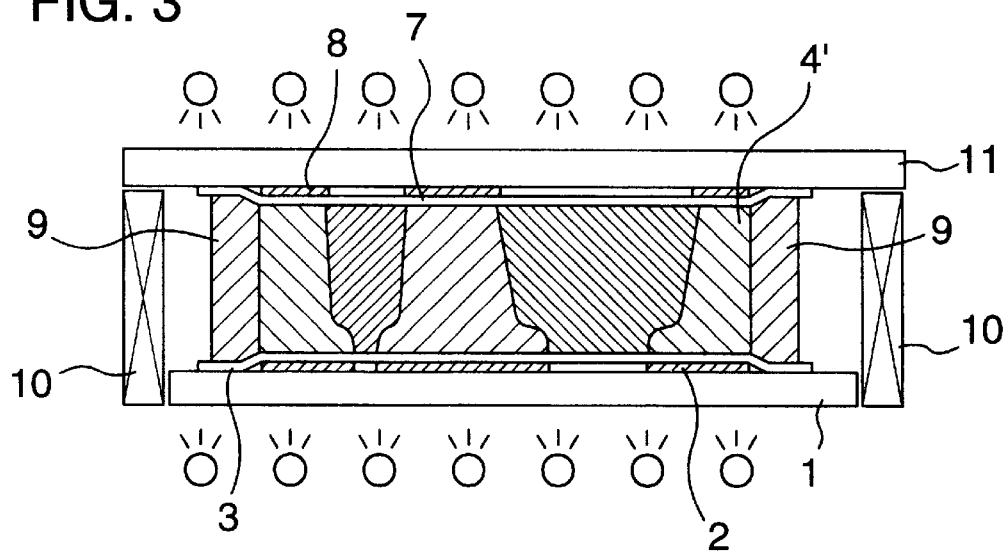
FIG. 3 is a sectional view illustrating the exposure step in the liquid photosensitive resin printing plate producing process.

Generally, in producing a "thick" printing plate, or a plate having a thickness of 4 mm or greater, first a negative film 2 and a cover film 3 are placed on a transparent substrate 1 and vacuum-attached thereto by making use of the openings, grooves and vacuum piping provided in the substrate 1 as shown in FIG. 3. Then a photosensitive resin 4 is laminated thereon in the form of a layer 4' by properly setting (A) the initial forming speed, (B) forming speed variation point and (C) forming speed variation according to the thickness of the plate being produced, after which a base film 7 and a masking film 8 are layered thereon. Thereafter, another transparent substrate 11 is placed on the spacers 10 set for determining the thickness of the printing plate to be produced, and active light is applied via this transparent substrate 11 to effect back exposure (masking exposure) for forming the base of the relief portion, and then active light is further applied via the negative film 2 from the transparent substrate 1 side to effect relief exposure for forming the relief portion of the image. Then the masking film 8 is removed and back exposure is conducted from the transparent substrate 11 side for fixing the formed relief portion and the base film.

Back exposure can be omitted in the above process.

Then the uncured photosensitive resin is washed away with a suitable detergent, followed by post-exposure and drying to provide the final product printing plate.

For making a relatively thin plate, back exposure is conducted via the transparent substrate 11 for forming the base of the relief portion on the whole plate surface without using the masking film 8, and then relief exposure is carried out from the transparent substrate 1 side for forming the relief portion of the image.

Here, the three-parameter method of the present invention is explained in detail.

Figure 1:
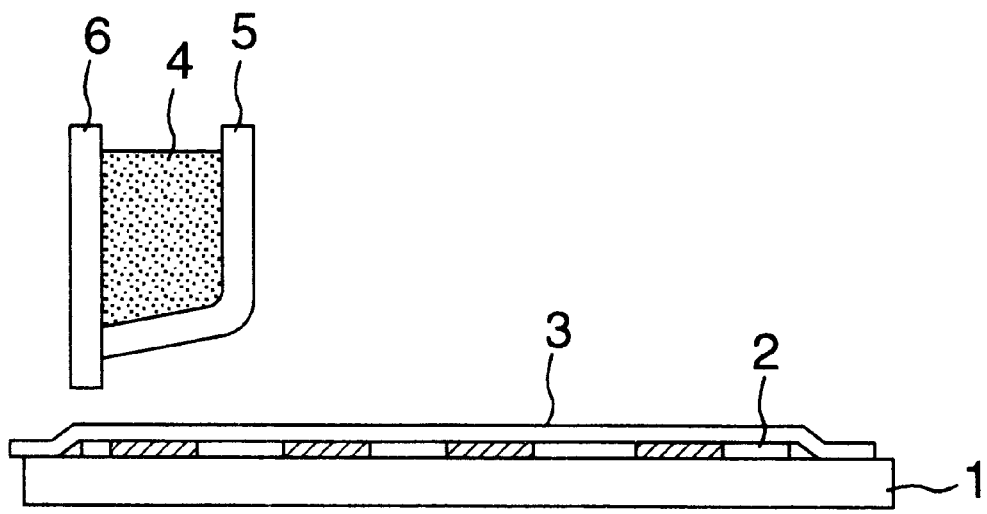
FIG. 1 is a sectional view illustrating a situation before forming (laminate forming) of a photosensitive resin by a bottom-open type bucket.
Figure 2:
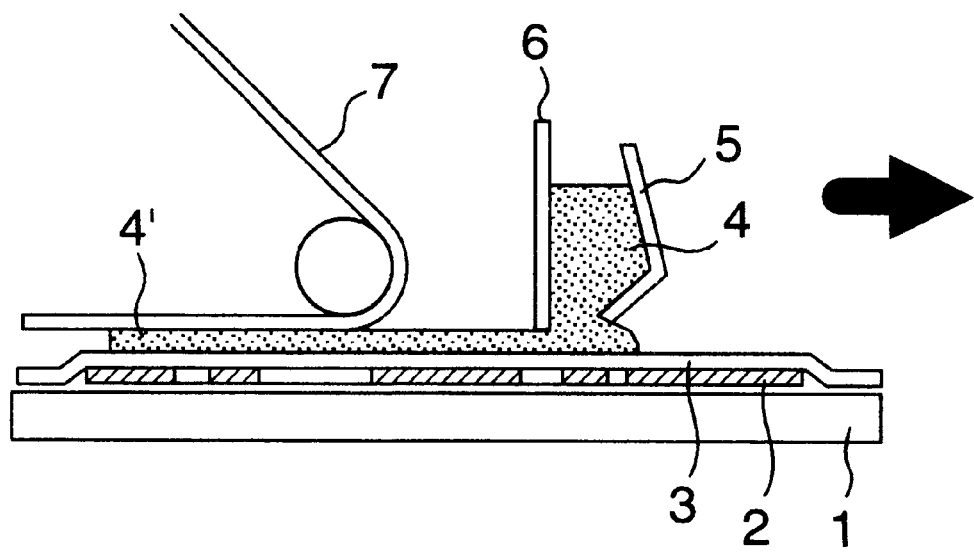
FIG. 2 is a sectional view illustrating the liquid photosensitive resin forming (laminate forming) step.
Figures 1, 4:
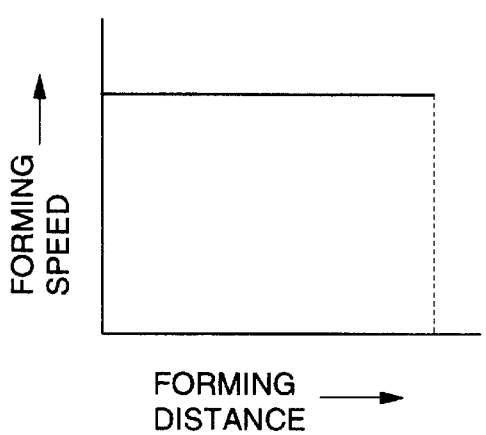
Figures 2, 4:
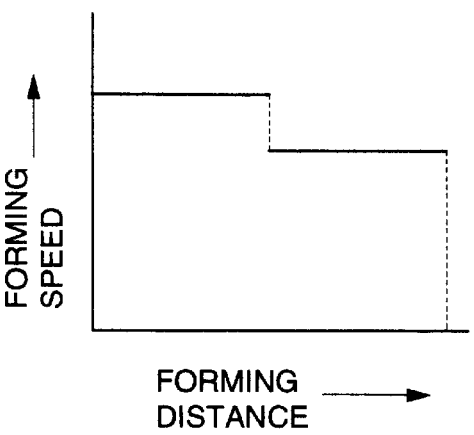

Hitherto, constant-rate forming method such as diagrammatically illustrated in FIG. 4-1 has been used for making small-size liquid photosensitive resin printing plates, while double variable speed forming method such as illustrated in FIG. 4-2 has been employed for making large-sized plates. However, in manufacture of the thick and large-sized plates mostly measuring around 7 mm in thickness and exceeding 1 m in length, for which the market demand is increasing recently, it was hardly possible even with the conventional double variable speed forming method to obtain a satisfactory plate thickness accuracy.

Figure 5:
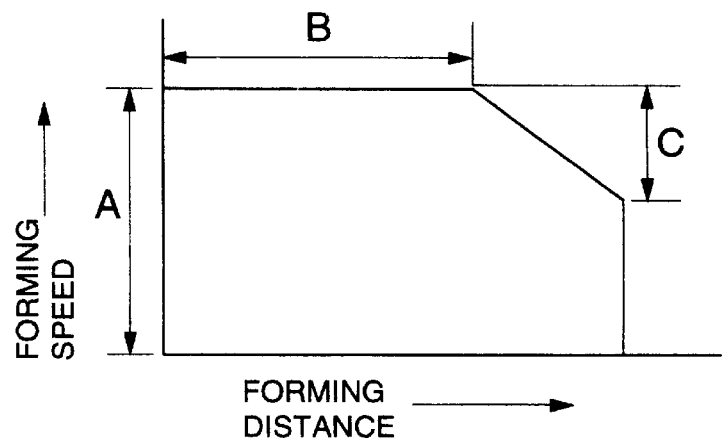
FIG. 5 shows a photosensitive resin forming speed diagram in the three-parameter method of the present invention.

In view of the above, the present invention is a process and an apparatus for producing a thick and large-sized photosensitive resin printing plate with high thickness accuracy in a stabilized way, by forming a liquid photosensitive resin into a layer while setting the initial forming speed (A), the forming speed variation point (B) and the forming speed variation (C) for every plate thickness as illustrated in FIG. 5, particularly by forming a liquid photosensitive resin into a layer while reducing the forming speed successively in accordance with the decrease of the resin in the bucket in the last half of the forming operation, more specifically by setting the forming speed variation point at a position which is 30 to 80% of the forming distance and then forming a liquid photosensitive resin into a layer while reducing the forming speed successively, so as to keep substantially constant the amount of the resin present in front of the doctor 6, or the "amount of bank".

Here, the "initial forming speed" means the substantial initial speed of movement of the forming means including the bucket when a photosensitive resin is molded to a specified plate thickness by a resin feed bucket. "Substantial" speed means the speed at the point when the speed of movement becomes constant, which does not include the speed in the region where the speed is increased by acceleration from the state of stoppage to a specified speed of movement.

"Forming speed variation point" means the distance from the forming starting position to the position of the forming means where the forming speed begins to vary from the said initial speed of forming. That is, it indicates the position of the forming means where variation of the forming speed begins. It is possible to express it by the point of time, but it is more convenient in terms of control to express it by relative position, so this way of expression is adopted here.

"Forming speed variation" means the difference between the initial forming speed and the forming speed at the final forming position, that is, it indicates the degree of variation of forming speed. For example, in case the initial forming speed is 20 mm/sec and the final forming speed is 12 mm/sec, the forming speed variation is 8 mm/sec.

"Forming distance" means the length in which the photosensitive resin is molded until reaching a specified plate thickness. To put it more concretely, it means the photosensitive resin forming length in the direction of movement of the forming means. Usually, there is taken a forming distance which is approximately 3 to 15% greater than the length of the photosensitive resin printing plate to be made.

Mechanical means can be employed for effecting a successive speed reduction, but electrical speed control means is used for ensuring more precise control. Usually, speed control is made by an inverter or inverter/sequencer unit (programmable controller).

The thick and large-sized printing plate obtained in the manner described above, in comparison with those produced by the conventional methods, is very small in difference of plate thickness between the first half portion and the last half portion of the forming, and most remarkably, it is free from decrease in plate thickness at the outer periphery in the last half portion of the forming, and hence small in variation of printing pressure in the printing operation. Thus, this printing plate can give a clear-cut and small-gain printing image with a high degree of faithfulness to the original.

The parameters A, B and C are variable depending on the shape of the bucket and the viscosity of the photosensitive resin used, but generally, the following conditions are preferred for providing high efficiency and practicality, which makes it possible to obtain a uniform resin forming thickness: For a 7 mm thick plate, the initial forming speed A is set at usually 20–40 mm/sec, preferably 28–35 mm/sec. For a plate with a length of not less than 1.3 m in the forming direction, the forming speed variation point B is provided at a position which is 30–80%, preferably 50–70% of the forming length, and the forming speed variation C is adjusted to fall within the range of 3–20 mm/sec, preferably 5–15 mm/sec.

For a 6 mm thick plate, A is 25–30 mm/sec, B is 40–70% of the forming length, and C is 5–12 mm/sec; for a 5 mm thick plate, A is 23–28 mm/sec, B is 40–70% of the forming length, and C is 3–12 mm/sec; and for a 4 mm thick plate, A is 20–28 mm/sec, B is 40–70% of the forming length, and C is 3–10 mm/sec.

As the material of the transparent substrates used in the plate producing process of the present invention, there can be used, for example, glass, crystal (silica glass), plastic materials such as acrylic resins, polycarbonate resins and polyvinyl chloride resins, and transparent ceramic materials.

Figure 6:
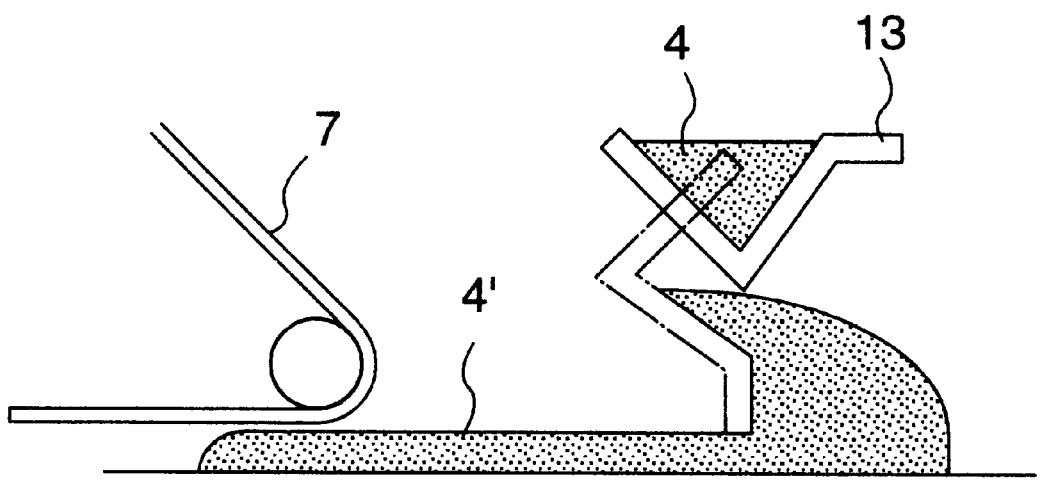
FIG. 6 is a sectional view illustrating a rotary bucket.

As the forming means in the present invention, it is possible to use, for example, a bottom-open type bucket 5 such as illustrated in FIGS. 1 and 2, and a rotary type bucket 13 such as illustrated in FIG. 6.

The present invention is further illustrated by the following examples.

EXAMPLE 1

On a pyrex glass-made lower hard transparent substrate polished to a high planar accuracy, a negative film and a cover film were vacuum-attached, on which a liquid photosensitive resin APR F-91 (a trademark, produced by Asahi Chemical Industry Co., Ltd.) was laminated under the conditions of initial forming speed=31 mm/sec, forming speed variation point=900 mm and forming speed variation=8 mm/sec, to form a 7 mm thick photosensitive resin layer, and a pyrex glass-made upper hard substrate polished to a high planar accuracy was placed thereon through the medium of a base film and a masking film, which are made of polyester, with the interval between the said two hard substrates being secured by spacers. This structure was kept as it was for 3 minutes while maintaining close adhesion of the masking film and the base film to the upper hard substrate by vacuum suction, and then irradiated with active light via the upper transparent substrate and the masking film to effect masking exposure for 150 seconds, after which active light was further applied via the lower transparent substrate and the negative film to effect relief exposure for 130 seconds, and then the masking film was removed. This was followed by 20-second back exposure by irradiation with active light via the upper transparent substrate to complete image forming exposure.

The thus treated photosensitive layer was washed with a cleaning fluid by a conventional method, then developed, post-exposed and dried to obtain a 7 mm thick, 700 mm wide and 1,300 mm long printing plate.

Thickness accuracy of this plate is shown in Table 1.

COMPARATIVE EXAMPLE 1

A 7 mm thick printing plate was made by following the same procedure as in Example 1 except that the photosensitive resin was laminated according to the "double variable speed method" featured by the initial forming speed of 31 mm/sec, the forming speed variation point of 930 mm and the secondary forming speed of 27 mm/sec. The results are shown in Table 1.

COMPARATIVE EXAMPLE 2

A 7 mm thick printing plate was made by following the same procedure as in Example 1 except that the photosensitive resin was laminated at a constant forming speed of 31 mm/sec. The results are shown in Table 1.

TABLE 1

| Example | Laminating method | Plate thickness accuracy | Plate thickness profile |
| --- | --- | --- | --- |
| Example 1 | 3-parameter method | 7/100 mm | Substantially uniform |
| Comp. Example 1 | Double variable speed method | 13/100 mm | Outer peripheral portion of the rear end of the forming is small in thickness |
| Comp. Example 2 | Constant rate method | 45/100 mm | Last half portion of the forming is very small in thickness |

EXAMPLE 2

The procedure of Example 1 was followed except for the use of a liquid photosensitive resin APR F-300 (a trademark, produced by Asahi Chemical Industry Co., Ltd.) and proper setting of the initial forming speed A, forming speed variation point B and forming speed variation C to obtain a 900 mm wide and 1,300 mm long printing plates. The results are shown in Table 2.

TABLE 2

| | Forming condition parameters | | | Carriage | Plate |
| --- | --- | --- | --- | --- | --- |
| Plate thickness (mm) | Initial speed (mm/s) | Speed variation point (mm) | Speed variation (mm/s) | start waiting period (sec) | thickness accuracy ($10^{-1}$ mm) |
| 4.0 | 26 | 800 | 5 | 2.0 | 8 |
| 5.0 | 30 | 800 | 10 | 0.7 | 7~8 |
| 6.0 | 33 | 800 | 10 | 0.7 | 6~8 |
| 7.0 | 33 | 809 | 10 | 0.7 | 5~8 |
| 7.5 | 38 | 800 | 10 | 0.7 | 7~8 |
| 8.0 | 35 | 800 | 12 | 0.1 | 6~8 |

According to the present invention, a thick and large-sized photosensitive resin printing plate exhibiting excellent ink receptivity and transferability regardless of the size of the plate surface image area and capable of forming a printed image which is clear and vivid throughout and being small in gain resulting from excess printing pressure, and which has high faithfulness to the original can be obtained without increasing the burdens on workers or plate-making time. Thus, the present invention provides an ideal method and apparatus for making printing plates for corrugated board printing, film printing, label printing and such type of printing.

What is claimed is:

1. A process for producing a photosensitive resin printing plate comprising a step of forming a liquid photosensitive resin into a layer by applying the same to a substrate with a bucket, wherein a forming speed variation point for said layer is set at a position which is 30 to 80% of the forming distance of said layer, and wherein the liquid photosensitive resin is formed into a layer by successively reducing the forming speed thereafter.

2. An apparatus for producing a photosensitive resin printing plate having means for forming a liquid photosensitive resin into a layer by applying the same with a bucket, said apparatus comprising a mechanism for controlling the following three parameters that are associated with forming the layer and which are: (A) initial forming speed, (B) forming speed variation point and (C) forming speed variation, and wherein the liquid photosensitive resin is formed into a layer by successively reducing the forming speed.

3. The process according to claim 1, wherein the forming speed is successively reduced by mechanical means or by electrical speed control means.

4. The apparatus according to claim 2, wherein the forming speed is successively reduced by mechanical means or by electrical speed control means.

5. The process according to claim 1, wherein the forming distance is approximately 3 to 15% greater than the length of the photosensitive resin printing plate being produced.

6. The process according to claim 1, wherein the forming speed variation point is set at a position which is 50 to 70% of the forming distance of the layer.

7. The apparatus according to claim 2, wherein the forming speed variation point is set at a position which is 30 to 80% of the forming distance of the layer.

8. The process according to claim 1, wherein the forming speed variation point is set at a position which is 40 to 70% of the forming distance of the layer.

9. The process according to claim 1, wherein the substrate is selected from the group consisting of glass crystal, plastic materials and transparent ceramic materials.

10. The process according to claim 9, wherein the plastic materials are selected from the group consisting of acrylic resins, polycarbonate resins and polyvinylchloride resins.

11. The process according to claim 1, wherein the plate is 4 to 8 mm thick.

12. The apparatus according to claim 2, wherein the plate is 4 to 8 mm thick.

* * * * *